United States Patent
Kung

(10) Patent No.: US 8,502,511 B1
(45) Date of Patent: Aug. 6, 2013

(54) BUCK SWITCHING REGULATOR

(71) Applicant: Nien-Hui Kung, Hsinchu (TW)

(72) Inventor: Nien-Hui Kung, Hsinchu (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 0 days.

(21) Appl. No.: 13/733,569

(22) Filed: Jan. 3, 2013

(51) Int. Cl.
*G05F 1/613* (2006.01)
*G05F 1/40* (2006.01)
*G05F 5/00* (2006.01)

(52) U.S. Cl.
USPC ............ 323/225; 323/272; 323/288; 323/299

(58) Field of Classification Search
USPC ................. 323/225, 271, 272, 282–284, 288, 323/299, 301, 351
See application file for complete search history.

(56) References Cited

U.S. PATENT DOCUMENTS

| | | | |
|---|---|---|---|
| 7,026,801 B2 * | 4/2006 | Fowler et al. | 323/271 |
| 7,235,955 B2 | 6/2007 | Solie et al. | |
| 7,889,002 B2 * | 2/2011 | Berkhout | 330/251 |
| 8,174,248 B2 * | 5/2012 | Mavencamp et al. | 323/225 |
| 8,207,720 B2 * | 6/2012 | Tang et al. | 323/271 |
| 2008/0068868 A1 * | 3/2008 | Williams | 363/21.06 |
| 2012/0126765 A1 * | 5/2012 | Stone et al. | 323/283 |

* cited by examiner

*Primary Examiner* — Jessica Han
(74) *Attorney, Agent, or Firm* — Tung & Associates

(57) ABSTRACT

The present invention discloses a buck switching regulator including a power stage, a driver circuit and a bootstrap capacitor. The power stage includes an upper-gate switch, a first lower-gate switch and a second lower-gate switch. The first upper-gate switch is electrically connected between an input terminal and a switching node. The first lower-gate switch is connected in parallel with the second lower-gate switch, both of which are electrically connected between the switching node and a first node. The driver circuit controls the operation of the upper-gate switch and the first lower-gate switch. The bootstrap capacitor is electrically connected between a boot node and the switching node, wherein the boot node is electrically connected to a supply voltage. When a voltage across the bootstrap capacitor is smaller than a reference voltage, the second lower-gate switch is turned on to charge the bootstrap capacitor from the supply voltage.

10 Claims, 4 Drawing Sheets

US 8,502,511 B1

BUCK SWITCHING REGULATOR

BACKGROUND OF THE INVENTION

1. Field of Invention

The present invention relates to a buck switching regulator; particularly, it relates to such buck switching regulator having improved power utilization efficiency.

2. Description of Related Art

FIG. 1 shows a schematic diagram of a conventional buck switching regulator. The power stage 11 of the conventional buck switching regulator 10 comprises an upper-gate switch MA, a lower-gate switch MB and an inductor L, all of which are electrically connected to a switching node Lx and controlled by a driver circuit 12. In the driver circuit 12, an upper-gate driver circuit 121 and a lower-gate driver circuit 122 generate a first operation signal SA and a second operation signal SB in response to a first operation signal S121 and a second operation signal 5122, respectively, to turn ON/OFF the upper-gate switch MA and the lower-gate switch MB, thus delivering power from an input terminal IN to an output terminal OUT (The rest of the driver circuit 12 which is irrelevant to the present invention is omitted for simplicity).

When the input voltage Vin supplied from the power source is high, for better driving the upper-gate switch MA, the conventional buck switching regulator 10 usually includes a bootstrap capacitor CBOOT between the supply voltage Vdd in the driver circuit 12 and the source of the upper-gate switch MA (as shown in FIG. 1), i.e., between the boot node VBOOT and the switching node Lx, to provide a desired voltage difference between the gate and the source of the upper-gate switch MA. The voltage Vcap across the bootstrap capacitor CBOOT serves to provide an operational voltage to the upper-gate driver circuit 121. When the lower-gate switch MB is ON, the supply voltage Vdd in the driver circuit 12 charges the bootstrap capacitor CBOOT through a diode 13, so that when the lower-gate switch MB is OFF, the voltage at the boot node VBOOT becomes Vcap+VLx. Thus, the difference between the voltage at the boot node VBOOT (Vcap+VLx) and the voltage at the switching node Lx (VLx) can be Vcap to provide a driving voltage which is required by the upper-gate driver circuit 121. The diode 13 serves to prevent a reverse current from flowing from the boot node VBOOT toward the supply voltage Vdd when the voltage at the boot node VBOOT is higher than the supply voltage Vdd, so that there will not be such reverse current damaging the supply voltage Vdd. The output terminal can be electrically connected to a system load 16 or a battery (not shown). When the system load 16 is consuming power (i.e., when the buck switching regulator 10 is required to supply power to the system load 16), the upper-gate switch MA and the lower-gate switch MB continue switching to deliver power from the input terminal IN to the output terminal OUT, and further to the system load 16. Hence, the bootstrap capacitor CBOOT will be routinely charged and refreshed so that the voltage Vcap across the bootstrap capacitor CBOOT will be kept at a desired level.

Nevertheless, when the system load 16 is in a stand-by mode (i.e., when the system load 16 consumes no or little power), both the upper-gate switch MA and the lower-gate switch MB are turned OFF since there is no need to deliver power from the input terminal IN to the output terminal OUT. Under such circumstance, the bootstrap capacitor CBOOT will not be charged and refreshed, and the charges stored in the bootstrap capacitor CBOOT will dissipate so that the voltage Vcap across the bootstrap capacitor CBOOT will drop gradually. At a certain time point, when the system load 16 resumes its normal operation, the buck switching regulator 10 is again required to supply the power. However, due to insufficient voltage Vcap across the bootstrap capacitor CBOOT, the voltage at the boot node VBOOT is insufficient, so the upper-gate driver circuit 121 does not have a sufficient driving capability to drive the upper-gate switch MA. As a result, when the conventional buck switching regulator 10 restores operation, it is required to charge the bootstrap capacitor CBOOT first. The way for charging the bootstrap capacitor CBOOT is to turned ON the lower-gate switch MB first so that the switching node Lx is electrically connected to ground, whereby the supply voltage Vdd can charge the bootstrap capacitor CBOOT through the diode 13.

Please refer to FIG. 2, which is a schematic diagram showing how the conventional buck switching regulator 10 unnecessarily consumes power. As described above, during the transition from stand-by to normal operation, it is required to turn ON the lower-gate switch MB first (during the period from the time point "Restore Operation" to the time point T1, as shown in FIG. 2), so a reverse current will flow in the reverse direction from the output terminal OUT to the lower-gate switch MB. Next, during the period from the time point T1 to the time point T2, when the upper-gate switch MA is turned ON and the lower-gate switch MB is turned OFF, a reverse current will flow in the reverse direction from the output terminal OUT to the upper-gate switch MA. The above power transmission in the reverse directions from the output terminal OUT will result in unnecessarily waste of power. Furthermore, improper control of such reverse power transmission will result in a boost operation from the output terminal OUT to the input terminal IN. In addition, if the output terminal OUT is electrically connected to a battery (not shown), the battery will keep discharging, which is also undesired.

In order to overcome the above-mentioned drawbacks, U.S. Pat. No. 7,235,955 has proposed a solution, but its control mechanism is complicated.

In view of the above, to overcome the drawbacks in the prior art, the present invention proposes a buck switching regulator having improved power utilization efficiency.

SUMMARY OF THE INVENTION

An objective of the present invention is to provide a buck switching regulator.

To achieve the above and other objectives, from one perspective, the present invention provides a buck switching regulator for converting an input voltage supplied from an input terminal to an output voltage at an output terminal, comprising: a power stage, including: an upper-gate switch having one end electrically connected to the input terminal and another end electrically connected to a switching node; a first lower-gate switch having one end electrically connected to the switching node and another end electrically connected to a first node, wherein the first node is electrically connected to ground; a second lower-gate switch having one end electrically connected to the switching node and another end electrically connected to the first node; and an inductor having one end electrically connected to the switching node and another end electrically connected to the output terminal; a driver circuit for controlling the operation of the upper-gate switch and the first lower-gate switch; and a bootstrap capacitor, which is electrically connected between a boot node and the switching node, wherein the boot node is electrically connected to a supply voltage; wherein when a voltage across the bootstrap capacitor is smaller than a reference voltage, the second lower-gate switch is turned on to charge the bootstrap capacitor from the supply voltage.

In one embodiment, the driver circuit includes: an upper-gate driver circuit for generating a first operation signal to control the operation of the upper-gate switch, wherein the voltage across the bootstrap capacitor is for providing an operational voltage to the upper-gate driver circuit; and a lower-gate driver circuit for generating a second operation signal to control the operation of the first lower-gate switch.

In one embodiment, the driver circuit further includes: a comparison circuit for comparing the voltage across the bootstrap capacitor with the reference voltage to control the second lower-gate switch in response to the comparison.

In one embodiment, the buck switching regulator further comprises a diode having an anode electrically connected to the supply voltage and a cathode electrically connected to the boot node.

In one embodiment, the buck switching regulator further comprises a power protection switch having one end electrically connected to the input terminal and another end electrically connected to the upper-gate switch, for protecting a power source electrically connected to the output terminal. The power protection switch includes a transistor electrically connected between the input terminal and the upper-gate switch, and the transistor includes a parasitic diode for preventing a reverse current from flowing from the upper-gate switch toward the input terminal. Or, the power protection switch includes a transistor electrically connected between the input terminal and the upper-gate switch, and the transistor includes a parasitic diode whose polarity is adjustable.

In one embodiment, the output terminal is electrically connected to a system load or a battery. The output terminal is electrically connected to the battery through a transistor, and the transistor includes a parasitic diode for preventing a reverse current from flowing from the output terminal toward the battery. Or, the output terminal is electrically connected to the battery through a transistor which includes a parasitic diode whose polarity is adjustable.

The objectives, technical details, features, and effects of the present invention will be better understood with regard to the detailed description of the embodiments below, with reference to the attached drawings.

DESCRIPTION OF THE PREFERRED EMBODIMENTS

Figure 1:
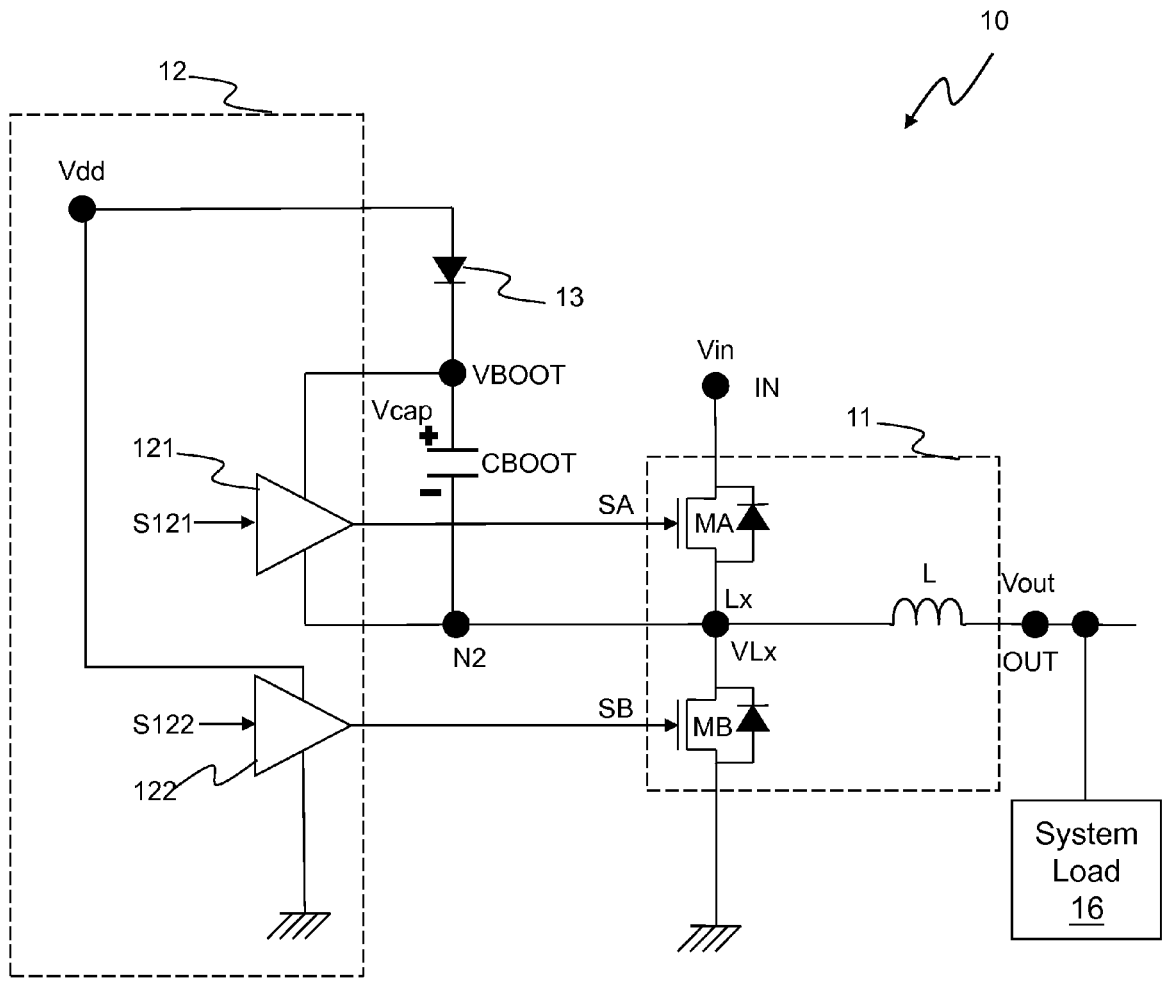
FIG. 1 shows a schematic diagram of a conventional buck switching regulator.
Figure 2:
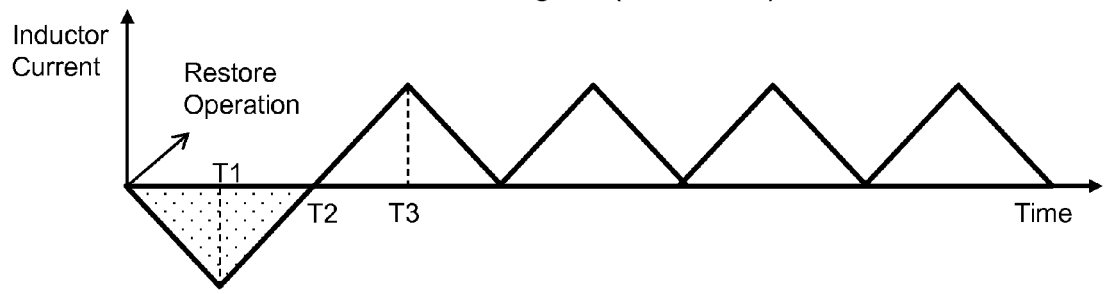
FIG. 2 is a schematic diagram showing that how the conventional buck switching regulator unnecessarily consumes power.

The above and other technical details, features and effects of the present invention will be will be better understood with regard to the detailed description of the embodiments below, with reference to the drawings. In the description, the words relate to directions such as "upper", "lower", "left", "right", "forward", "backward", etc. are used to illustrate relative orientations in the drawings and should not be considered as limiting in any way. The drawings as referred to throughout the description of the present invention are for illustration only, to show the interrelations between the apparatus and the devices, but not drawn according to actual scale.

Figure 3:
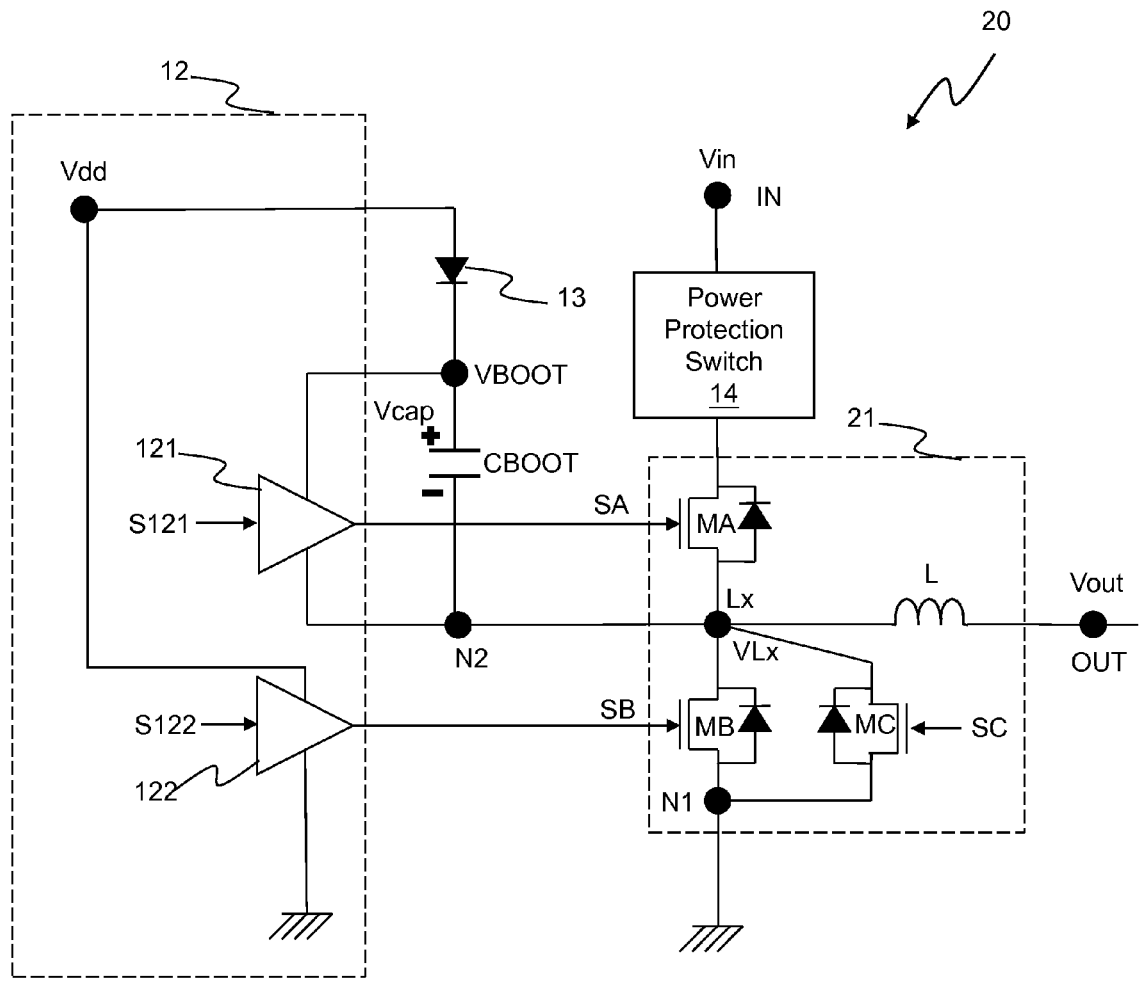
FIG. 3 shows a schematic diagram of a buck switch regulator according to a first embodiment of the present invention.

Please refer to FIG. 3, which shows a schematic diagram of a buck switch regulator according to a first embodiment of the present invention. The buck switch regulator 20 of this embodiment comprises a power stage 21, a driver circuit 21 and a bootstrap capacitor CBOOT. In addition, the buck switch regulator 20 can optionally (not necessarily required) comprise a diode 13 and a power protection switch 14. The power stage 21 of the buck switch regulator 20, as compared with the power stage 11 of the conventional buck switch regulator 10 (as shown in FIG. 1), comprises one upper-gate switch MA and two lower-gate switches, i.e., the first lower-gate switch MB and the second lower-gate switch MC. The size of the second lower-gate switch MC can be smaller than that of the first lower-gate switch MB (the benefits and efficacies of such arrangement will be discussed later). The upper-gate switch MA, the first lower-gate switch MB, the second lower-gate switch MC and an inductor L are electrically connected to a switching node Lx and controlled by a driver circuit 12. In this embodiment, the upper-gate switch MA can be, for example but not limited to, an NMOS transistor while the first lower-gate switch MB and the second lower-gate switch MC can be, for example but not limited to, an NMOS transistor or a PMOS transistor. Specifically, the upper-gate switch MA has one end electrically connected to an input terminal IN and another end electrically connected to a switching node Lx. The first lower-gate switch MB has one end electrically connected to the switching node Lx and another end electrically connected to a first node N1, in which the first node N1 is electrically connected to ground. The second lower-gate switch MC has one end electrically connected to the switching node Lx and another end electrically connected to the first node N1. In other words, the first lower-gate switch MB and the second lower-gate switch MC are, in fact, connected in parallel with each other between the switching node Lx and the first node N1 (or ground). The inductor L has one end electrically connected to the switching node Lx and the other end electrically connected to the output terminal OUT. In the driver circuit 12, an upper-gate driver circuit 121 and a lower-gate driver circuit 122 generate a first operation signal SA and a second operation signal SB in response to a first operation signal 5121 and a second operation signal 5122, respectively, to turn ON/OFF the upper-gate switch MA and the first lower-gate switch MB, thus delivering power from the input terminal IN to the output terminal OUT.

In this embodiment, the output terminal OUT can be electrically connected to a system load (not shown) or a battery (not shown), to supply power thereto (examples as to how the output terminal OUT is electrically connected to a system load or a battery will be discussed later). A bootstrap capacitor CBOOT is electrically connected between a boot node VBOOT and a second node N2 (i.e., between the boot node VBOOT and the switching node Lx) to provide a desired voltage difference between the gate and the source of the upper-gate switch MA. The voltage Vcap across the bootstrap capacitor CBOOT serves to provide an operational voltage to the upper-gate driver circuit 121. In this embodiment, the bootstrap capacitor CBOOT is disposed, for example but not limited to, outside the driver circuit 12. In another embodiment, the bootstrap capacitor CBOOT can be integrated inside the driver circuit 12. The circuit of this embodiment also comprises a diode 13 having an anode electrically connected to a supply voltage Vdd in the driver circuit 12 and a cathode electrically connected to the boot node VBOOT. The supply voltage Vdd can be obtained from, for example but not limited to, the input voltage Vin. The diode 13, as described above, serves to prevent a reverse current from flowing from the boot node VBOOT toward the supply voltage Vdd when the voltage at the boot node VBOOT is higher than the supply voltage Vdd, so that there will not be such reverse current damaging the supply voltage Vdd.

How the present invention has better power utilization efficiency is explained below.

Figure 4:
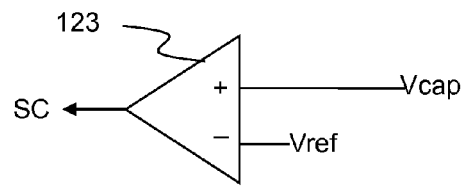
FIG. 4 is a schematic diagram showing how the present invention generates a third operation signal.
Figure 5:
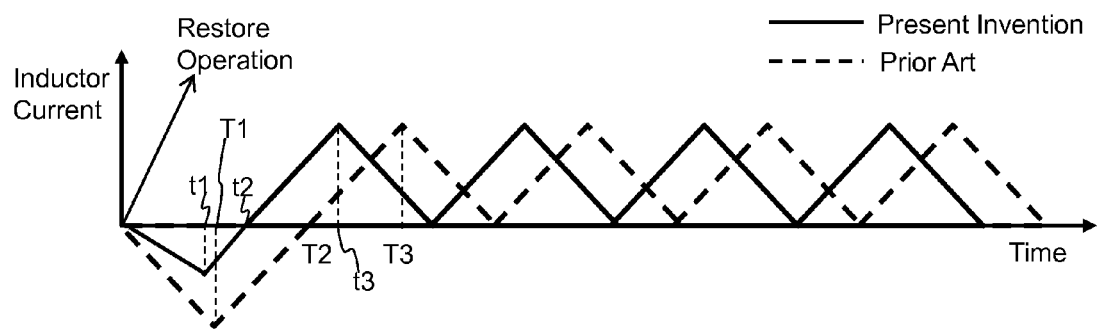
FIG. 5 is a schematic diagram showing that the present invention, as compared with the conventional buck switching regulator, has improved power transmission efficiency.

Please refer to FIGS. 3-5. When the system load (not shown) transits from stand-by (no load or light load) to normal operation, the buck switching regulator 20 is required to restore operation under the condition where the upper-gate switch MA and the first lower-gate switch MB are OFF. However, the voltage Vcap across the bootstrap capacitor CBOOT is insufficient because the charges stored in the bootstrap capacitor CBOOT have dissipated, and the bootstrap capacitor CBOOT cannot provide the operational voltage required by the upper-gate driver circuit 121.

When the buck switching regulator 20 restores operation, a comparison circuit 123 can be employed to determine whether the voltage Vcap is smaller than a reference voltage Vref, as shown in FIG. 4. The comparison circuit 123 can be, for example but not limited to, a comparator or an operational amplifier and can be integrated into, e.g., the driver circuit 12. If the voltage Vcap is smaller than the reference voltage Vref, the comparison circuit 123 generates a third operation signal SC, so that the second lower-gate switch MC is turned ON during the period from the time point "Restore Operation" to the time point t1 (as shown in FIG. 5). During this period, the first lower-gate switch MB is still OFF, and the upper-gate switch MA is also OFF. When the second lower-gate switch MC is turned ON, the voltage (VLx) at the switching node Lx is 0V because the switching node Lx is electrically connected to ground, thus causing the supply voltage Vdd to charge the bootstrap capacitor CBOOT through the diode 13. As a consequence, the difference between the voltage of the boot node VBOOT (Vcap+VLx) and the voltage of the switching node Lx (VLx) can reach Vcap to provide the operational voltage required by the upper-gate driver circuit 121. Next, at and after the time point t1 when the upper-gate switch MA is turned ON, the third operation signal SC generated by the comparison circuit 123 will turned OFF the second lower-gate switch MC because the voltage Vcap of the bootstrap capacitor CBOOT is larger than or equal to the above-mentioned reference voltage Vref. After the time point t2, the upper-gate switch MA and the first lower-gate switch MB restore back to the normal switching mode, so power is delivered from the input terminal IN to the output terminal OUT and supplied to the system load (not shown). In this embodiment, the second lower-gate switch MC is simply turned ON for once during the period from the time point "Restore Operation" to the time point t1, and thereafter can be turned OFF. However, in another embodiment, the second lower-gate switch MC can also be turned ON intermittently.

Please refer to FIG. 5. The present invention possesses the advantages as described below. When re-charging the bootstrap capacitor CBOOT, because the present invention only turns ON the second lower-gate switch MC which is of a smaller size, the reverse current flowing from the output terminal OUT to the second lower-gate switch MC, as compared with the conventional buck switching regulator 10, is very little. Hence, in the present invention, the power loss resulting from the reverse current flowing from the output terminal OUT, as compared with the conventional buck switching regulator 10, is apparently very little. In addition, because the reverse trend of the inductor current is much smaller, the present invention can restore to the normal switching mode in a much shorter time (the time point t2 is earlier than the time point T2). Therefore, the present invention is apparently superior to the prior art.

Figure 6A:
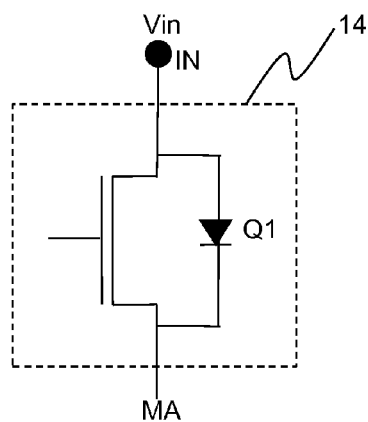
FIGS. 6A and 6B show two embodiments of the power protection switch.
Figure 6B:
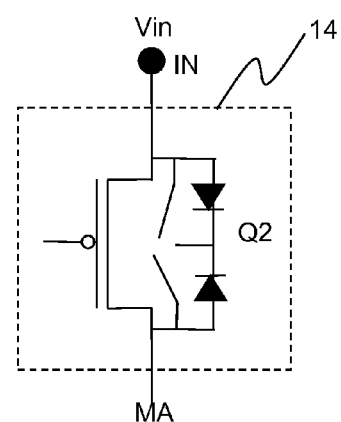

Please refer to 6A and 6B, which show two embodiments of the power protection switch. In certain applications of the present invention, a power protection switch 14 can be provided between the input terminal IN and the upper-gate switch MA (as shown in FIG. 3), and such power protection switch 14 is capable of preventing a reverse current. The power protection switch 14 includes a transistor Q1 (as shown in FIG. 6A) or a transistor Q2 whose parasitic diode polarity is adjustable (as shown in FIG. 6B). In the embodiment shown in FIG. 6A, the parasitic diode of the transistor Q1 has its anode electrically connected to the input terminal IN and its cathode electrically connected to the upper-gate switch MA. In other words, the polarity of the parasitic diode of the transistor Q1 is opposite to that of the upper-gate switch MA. Accordingly, when the voltage at the node connected to the upper-gate switch MA is higher than the input voltage Vin, the parasitic diode of the transistor Q1 is capable of preventing a reverse current from flowing in the reverse direction from the upper-gate switch MA to the input terminal IN. Or, for another example, as shown in FIG. 6B, the parasitic diode of the transistor Q2 has a polarity which is adjustable. Therefore, when the voltage at the node connected to the upper-gate switch MA is higher than the input voltage Vin, the anode-cathode direction of the parasitic diode can be set to be opposite to the direction of the reverse current to prevent the reverse current from flowing in the reverse direction. And when the voltage at the upper-gate switch MA is lower than the input voltage Vin, to prevent a forward current from flowing in the forward direction from the input terminal IN to the upper-gate switch MA (e.g., when it is desired to stop operating the buck switching regulator 20), the anode-cathode direction of the parasitic diode can be set to be opposite to the direction of the forward current. Thus, the power protection switch 14 can protect the power source or control the buck switching regulator 20.

Figure 7A:
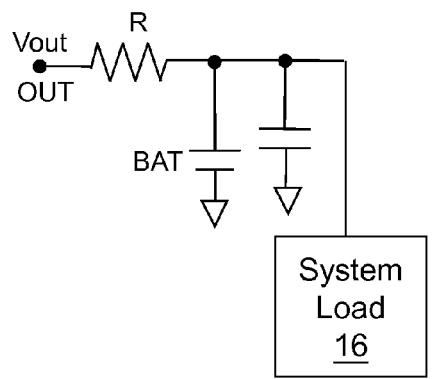
FIGS. 7A-7C are several embodiments showing how the output terminal is electrically connected to a system load or a battery according to the present invention.
Figure 7B:
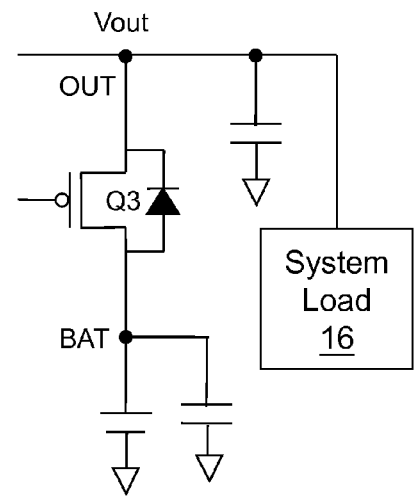
Figure 7C:
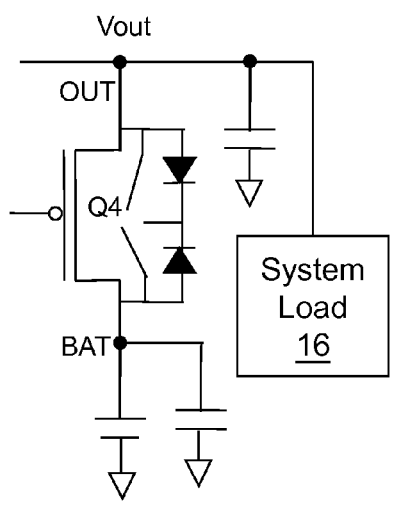

Please refer to 7A-7C, which are several embodiments showing how the output terminal is electrically connected to a system load or a battery according to the present invention. The output terminal OUT of the present invention can be electrically connected to a system load 16 or a battery BAT. The system load 16 can be, for example but not limited to, a handheld electronic device or any other device. The battery BAT can be, for example but not limited to, a battery connected outside or included in an apparatus or a power bank. Please refer to the embodiment shown in FIG. 7A. The output terminal OUT can be electrically connected to the system load 16 or the battery BAT through a resistor R. In this embodiment, the output current can be detected by means of the resistor R, as information for controlling the charging operation of the battery BAT. Please refer to another embodiment shown in FIG. 7B. The output terminal OUT can be electrically connected to the battery BAT through a transistor Q3. The battery BAT is charged from the output voltage Vout and the charging operation can be controlled by controlling the conduction of the transistor Q3. In addition, please refer to yet another embodiment shown in FIG. 7C. The output terminal OUT can be electrically connected to the battery BAT through a transistor Q4 whose parasitic diode has an adjustable polarity. The charging of the battery BAT from the output voltage Vout can be controlled by controlling the conduction of the transistor Q4. When the output terminal OUT charges the battery BAT, the anode-cathode direction of the parasitic diode can be set to be opposite to the charging direction. And, when the bootstrap capacitor CBOOT needs to be charged, the anode of the parasitic diode can be directed toward the output terminal OUT while the cathode of the parasitic diode can be directed toward the battery BAT, thus preventing the battery BAT from discharging undesirably.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a device which does not substantially influence the primary function of a signal can be inserted between any two devices in the shown embodiments, such as a switch. For another example, the comparison circuit is not limited to a comparator or an operational amplifier. If the transition level of a Smith trigger is set to be equal to the reference voltage Vref, then the Smith trigger can also act as a comparison circuit. For yet another example, the second lower-gate switch MC can be integrated inside the driver circuit 12 and regarded as apart of the driver circuit 12 instead of a part of the power stage 21. In view of the foregoing, the spirit of the present invention should cover all such and other modifications and variations, which should be interpreted to fall within the scope of the following claims and their equivalents.

What is claimed is:

1. A buck switching regulator for converting an input voltage supplied from an input terminal to an output voltage at an output terminal, comprising:
    a power stage, including:
        an upper-gate switch having one end electrically connected to the input terminal and another end electrically connected to a switching node;
        a first lower-gate switch having one end electrically connected to the switching node and another end electrically connected to a first node, wherein the first node is electrically connected to ground;
        a second lower-gate switch having one end electrically connected to the switching node and another end electrically connected to the first node; and
        an inductor having one end electrically connected to the switching node and another end electrically connected to the output terminal;
    a driver circuit for controlling the operation of the upper-gate switch and the first lower-gate switch; and
    a bootstrap capacitor, which is electrically connected between a boot node and the switching node, wherein the boot node is electrically connected to a supply voltage;

wherein when a voltage across the bootstrap capacitor is smaller than a reference voltage, the second lower-gate switch is turned on to charge the bootstrap capacitor from the supply voltage.

2. The buck switching regulator of claim 1, wherein the driver circuit includes:
    an upper-gate driver circuit for generating a first operation signal to control the operation of the upper-gate switch, wherein the voltage across the bootstrap capacitor is for providing an operational voltage to the upper-gate driver circuit; and
    a lower-gate driver circuit for generating a second operation signal to control the operation of the first lower-gate switch.

3. The buck switching regulator of claim 2, wherein the driver circuit further includes:
    a comparison circuit for comparing the voltage across the bootstrap capacitor with the reference voltage and controlling the second lower-gate switch in response to the comparison.

4. The buck switching regulator of claim 1, further comprising:
    a diode having an anode electrically connected to the supply voltage and a cathode electrically connected to the boot node.

5. The buck switching regulator of claim 1, further comprising:
    a power protection switch having one end electrically connected to the input terminal and another end electrically connected to the upper-gate switch, for protecting a power source electrically connected to the input terminal.

6. The buck switching regulator of claim 5, wherein the power protection switch includes a transistor electrically connected between the input terminal and the upper-gate switch, and the transistor includes a parasitic diode for preventing a reverse current from flowing from the upper-gate switch toward the input terminal.

7. The buck switching regulator of claim 5, wherein the power protection switch includes a transistor electrically connected between the input terminal and the upper-gate switch, and the transistor includes a parasitic diode whose polarity is adjustable.

8. The buck switching regulator of claim 1, wherein the output terminal is electrically connected to a system load or a battery.

9. The buck switching regulator of claim 8, wherein the output terminal is electrically connected to the battery through a transistor, and the transistor includes a parasitic diode for preventing a reverse current from flowing from the output terminal toward the battery.

10. The buck switching regulator of claim 8, wherein the output terminal is electrically connected to the battery through a transistor which includes a parasitic diode whose polarity is adjustable.

* * * * *